United States Patent [19]
Lundy et al.

[11] Patent Number: 5,939,239
[45] Date of Patent: Aug. 17, 1999

[54] PHOTOIMAGEABLE COMPOSITIONS CONTAINING PHOTOPOLYMERIZABLE URETHANE OLIGOMERS AND DIBENZOATE PLASTICIZERS

[75] Inventors: Daniel E. Lundy, Placentia; Robert Barr, Laguna Niguel, both of Calif.

[73] Assignee: Nichigo-Morton Co., Ltd., Tokyo, Japan

[21] Appl. No.: 08/999,875

[22] Filed: Dec. 1, 1997

[51] Int. Cl.$^6$ .............................. G03F 7/027; G03F 7/033
[52] U.S. Cl. ...................... 430/284.1; 430/912; 430/910; 522/95
[58] Field of Search .................. 430/284.1, 912, 430/910; 522/95

[56] References Cited

U.S. PATENT DOCUMENTS

| | | | |
|---|---|---|---|
| 4,003,877 | 1/1977 | Lipson et al. | 260/47 UA |
| 4,245,030 | 1/1981 | Faust et al. | 430/281.1 |
| 4,610,951 | 9/1986 | Lipson et al. | 430/313 |
| 4,695,527 | 9/1987 | Geissler et al. | 430/256 |
| 4,756,994 | 7/1988 | Araki et al. | 430/281.1 |
| 5,217,845 | 6/1993 | Steppan et al. | 430/281.1 |
| 5,362,605 | 11/1994 | Mirle et al. | 430/284.1 |
| 5,744,282 | 4/1998 | Ichikawa et al. | 430/284.1 |
| 5,805,358 | 9/1998 | Yamashita et al. | 359/742 |
| 5,837,422 | 11/1998 | Sasaki et al. | 430/284.1 |
| B1 3,953,309 | 4/1976 | Gilano et al. | 204/159.16 |

FOREIGN PATENT DOCUMENTS

| | | | |
|---|---|---|---|
| 0738927 | 4/1996 | European Pat. Off. | |
| 0 738 927 A2 | 10/1996 | European Pat. Off. | 430/284.1 |

OTHER PUBLICATIONS

AB JP 61077844 A—Abstract of Japanese Invention, WPINDEX, Copyright 1998, Derwent Information Ltd.
AB JP 07128851A—Abstract of Japanese Invention, WPINDEX, Copyright 1998, Derwent Information Ltd.
AB JP 09176253A—Abstract of Japanese Invention, WPINDEX, Copyright 1998, Derwent Information Ltd.
AB JP 60240715A—Abstract of Japanese Invention, WPINDEX, Copyright 1998, Derwent Information Ltd.

*Primary Examiner*—Cynthia Hamilton
*Attorney, Agent, or Firm*—Wayne E. Nacker; Gerald K. White

[57] ABSTRACT

In a negative acting photoimageable composition comprising an acid functional binder polymer, photopolymerizable $\alpha,\beta$-ethylenically unsaturated compounds, and photoinitiator, at least a portion of the photopolymerizable compounds are isocyanate trimers having tri-acrylate functionality. Further, the composition contains a dibenzoate plasticizer.

3 Claims, No Drawings

PHOTOIMAGEABLE COMPOSITIONS CONTAINING PHOTOPOLYMERIZABLE URETHANE OLIGOMERS AND DIBENZOATE PLASTICIZERS

The present invention is directed to negative-acting photoimageable compositions such as those used as photoresists used to form printed circuit boards. The photoimageable compositions contain, as at least a portion of a photopolymerizable component, a photopolymerizable urethane oligomer. Flexibility, and hence tenting ability, is improved through the inclusion of dibenzoate plasticizers.

BACKGROUND OF THE INVENTION

This invention is directed to negative-acting photoimageable compositions which are developable in alkaline aqueous solutions. The invention is particularly applicable to primary photoimaging resists, but is applicable, as well, to compositions that are hardenable so as to form solder masks and the like.

A variety of such photoimageable compositions are described. Essential components of compositions of the type to which the present invention is directed are A) a binder polymer; B) photopolymerizable α,β-ethylenically unsaturated compound(s), and C) a photoinitiator chemical system. The binder polymer A) has sufficient acid functionality, generally carboxylic acid functionality, that it is soluble in alkaline aqueous solution and thereby renders the photoimageable composition developable in alkaline aqueous solutions.

Printed circuit boards generally have through-holes by which circuitry on one side of the board is connected to circuitry on the other side of the board. Photoresists are required to "tent" these through-holes during processing. Through-holes in printed circuit boards are increasingly becoming larger; accordingly, tenting strength is becoming increasingly important. It is a general object of the invention to provide photoimageable compositions with increased flexibility for increased tenting strength. Flexibility also contributes to cross hatch adhesion, allowing for better compatibility with polyester removal systems. This is because if the photoresist is brittle, polyester removal systems cause chipping of the photoresist and attendant circuit line defects.

SUMMARY OF THE INVENTION

The negative-acting photoimageable composition comprises A) between about 29 and about 69 wt % based on total weight of A) plus B) plus C) of an organic polymeric binder having sufficient acid functionality to render the photoimageable composition developable in alkaline aqueous solution, B) between about 30 and about 60 wt % (calculated relative to total weight of A) plus B) plus C)) of an addition-polymerizable component, component B) comprising a nongaseous ethylenically unsaturated compound or compounds capable of forming a polymer by free-radical initiated chain-propagating addition polymerization, and between about 0.5 and about 15 wt % of C) (calculated relative to total weight of A) plus B) plus C)) of an organic, radiation-sensitive free-radical generating system activatable by actinic radiation to initiate chain-propagating addition polymerization of the addition-polymerizable material B). In accordance with the invention, component B) comprises an isocyanate trimer B') having tri-acrylate functionality, trimer B' comprising between about 2 and about 30 wt % relative to total weight of A) plus B) plus C); balance of B, i.e., up to 57 wt %, preferably at least about 5 wt %, relative to total weight of A) plus B) plus C) of B" comprising other α,β-ethylenically unsaturated monomers. In addition, compositions in accordance with the invention contain between about 1 and about 8 wt %, preferably between about 2 and about 6 wt % (calculated relative to total weight of A) plus B) plus C)) of D) a dibenzoate plasticizer.

DETAILED DESCRIPTION OF CERTAIN PREFERRED EMBODIMENTS

Herein, unless otherwise noted, all percentages are weight percentages. Component A) (the binder polymer), Component B) (the photoimageable compounds(s)) and Component C) (the photoinitiator chemical system) are herein considered to equal 100 wt %, and other components, including the dibenzoate plasticizer D), are calculated as parts relative to 100 parts of A) plus B) plus C).

The invention is directed to photoimageable compositions which are developable in alkaline aqueous solution and which therefore have substantial acid functionality. Such photoimageable compositions typically have a binder A) having acid functionality, typically an acid number of at least about 80, preferably at least about 100 and more preferably about 150 or more, up to about 250. The acid functionality is typically carboxylic acid functionality, but may also include, for example, sulfonic acid functionality or phosphoric acid functionality. Binder polymers for photoimageable compositions typically have weight average molecular weights between about 20,000 and about 200,000 preferably at least about 80,000.

The polymers are typically derived from a mixture of acid functional monomers and non-acid functional monomers. Some specific examples of suitable acid functional monomers are acrylic acid, methacrylic acid, maleic acid, fumaric acid, citraconic acid, 2-acrylamido-2-methylpropanesulfonic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer.

The acid functional monomers may be copolymerized with non-acid functional monomers, such as esters of acrylic acids, for example, methyl acrylate, methyl methacrylate, hydroxy ethyl acrylate, butyl methacrylate, octyl acrylate, 2-ethoxy ethyl methacrylate, t-butyl acrylate, n-butyl acrylate, 2-ethyl hexyl acrylate, n-hexyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

Examples of such polymers and photoimageable compositions using such polymers are found, in the following U.S. Pat. Nos.: 3,953,309, 4,003,877, 4,610,951, and 4,695,527 the teaching of each of which are incorporated herein by reference.

The photoimageable, acrylate functional, isocyanate trimer B') which comprises a portion of, and in some cases all of the photopolymerizable component B) has the general formula:

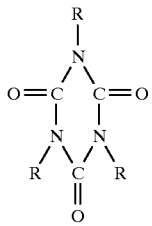

where R is —$(CH_2)_p$—NH—COO—$(CHY—CHY—O)_m$—CO—CX=$CH_2$, where X is H or $CH_3$, Y is H, $CH_3$, or $C_2H_5$, p is an integer from 1 to 36 and m is an integer from 1 to 14. Such trimers are described in European Patent Application EP 0 738 927 A2.

The balance of photopolymerizable component B), used at 0 to about 30 wt % of the photoimageable composition (calculated relative to total weight of A) plus B) plus C) is B"), typically a monomer, dimer or short chain oligomer having ethylenic unsaturation, particularly α,β-ethylenic unsaturation. The photopolymerizable component B) is typically a monomer, dimer or short chain oligomer having ethylenic unsaturation, particularly, α,β-ethylenic unsaturation, including monofunctional compounds and compounds having α,β-ethylenic unsaturation functionality 2 or greater. Typically, a mixture of mono-functional and multi-functional monomers will be used. Suitable photopolymerizable compounds include, but are not limited to, the monomers recited above as suitable for forming binder polymers, particularly the non-acid functional compounds.

To initiate polymerization of the monomers upon exposure to actinic radiation, the photoimageable composition contains photoinitiator chemical system. Suitable photoinitiators include, for example, 9-phenyl acridine, benzoin ethers, benzil ketals, acetophenones, banzophenones and related compounds with amines. Also, suitable 9-phenyl acridine homologues, such as those described in U.S. Pat. No. 5,217,845, the teachings of which are incorporated herein by reference, are useful photoinitiators.

Flexibility, herein, it further improved through the use of dibenzoate plasticizers in conjunction with the isocyanate trimers. This combination further contributes to fine line adhesion and good stripping characteristics. Dibenzoate plasticizers in accordance with the invention have the general formula:

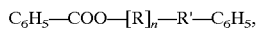

where

R=—CHX—CHX—O— where one or both Xs are H or one X may be $CH_3$ and the other H; n=1 to 10, and R' is —$CH_2$—CH($CH_3$)—OOC—, —$CH_2$—$CH_2$—OOC—, or —OC—.

Specific examples of suitable dibenzoates include, but are not limited to dipropyleneglycol dibenzoate, diethylene glycol dibenzoate, polypropyleneglycol dibenzoate, and polyethylene glycol dibenzoate. The dibenzoate plasticizer D) is used at levels of between about 1 and about 8 wt % relative to total weight of A) plus B) plus C), typically at between about 2 and about 6 wt %.

Compared to other plasticizers tested, the dibenzoates produced a significant improvement in tent strength. Coupled with improved flexibility, the combination of dibenzoate plasticizer and the isocyanate trimer produces a fine line (less than 75 microns) resist sidewall that adheres better to the copper surface. It is believed that the addition of the dibenzoate contributes to a lower glass transition temperature ($T_g$) of the formulation. The lower $T_g$ allows for better flow at lamination and better conformation to the copper surface. This property is particularly important on copper surfaces with nicks or scratches. Because the composition with the dibenzoate conforms better to the copper, more photoresist surface area is in contact with the copper surface. This results in more potential for chemical bonding to the copper surface and therefore, improved adhesion properties. Because the dibenzoate cannot be incorporated into the backbone of the exposed acrylic monomer system, the inclusion of the dibenzoate compounds results in less overall shrinkage of the composition. This reduced shrinkage probably produces less stress on the copper/photoresist interface, contributing to the improved adhesion. Less shrinkage is particularly observing if 9-phenyl acridine is used as the photoinitiator, as this initiator produces a high degree of cross-link density.

Most surprising is the improvement seen in stripping. Because the dibenzoate produces better adhesion, stripping the resist from the copper surface would be expected to be more difficult. For example, the sidewall of the photoresists containing the dibenzoate shows less attack in an alkaline-based developing solution. However, in the alkaline based stripping solution, the dibenzoate-based systems stripped up to 20% faster. This is likely related to the ester functionality in the backbone and the way it orients the polymerized matrix of the photoresist composition.

Overall, the combination of urethane oligomer (isocyanate trimer) provides excellent tenting strength, improved adhesion, improved stripping and improved conformation.

Additionally, the photoimageable compositions may contain a wide variety of additional components as are known in the art, including additional polymers, such as those which might be used to effect a final hardened cure of a solder mask, dyes, stabilizers, flexibilizing agents, fillers etc.

Processing of the photoimageable composition is in a conventional manner. In a typical procedure, a photoimageable composition layer, either formed from a liquid composition or transferred as a layer from a dry film, is applied to a copper surface of a copper-clad board. The photoimageable composition layer is exposed to actinic radiation through appropriate artwork. Exposure to actinic radiation polymerizes the monomer in the light-exposed areas, resulting in a cross-linked structure that is resistant to developer. Next, the composition is developed in dilute alkaline aqueous solution, such as a 1% sodium carbonate solution. The alkali solution causes salt formation with the carboxylic groups of the binder polymers, rendering them soluble and removable. After development, an etchant may be used to remove copper from those areas where the resist was removed, thereby forming a printed circuit. The remaining resist is then removed using an appropriate stripper.

The invention will now be described in greater detail by way of specific examples.

EXAMPLES

A base formulation (master batch) is prepared having the following components:

TABLE "A"

Master Batch (without Plasticizer or Urethane Oligomer)

| Ingredient | Weight | Chemical Type |
|---|---|---|
| Acrylic Polymer (23% methacrylic acid, 66% methylmethacrylate, 11% butyl acrylate) | 40.0 grams | Polymer Backbone |
| Phenoxy Polyethoxy monoacrylate | 10.0 grams | Monomer |
| 9-phenyacridine | 0.2 grams | Initiator |
| Benzotriazole | 0.05 grams | Adhesion Promoter |
| Carboxybenzotriazole | 0.05 grams | Adhesion Promoter |
| Nitrated Azo Dye (Furon Navy) | .075 grams | Background Dye |
| Methyl Hydroquinone | .015 grams | Antioxidant |
| Triphenyl methane Dye (Flexoblue 680) | .045 grams | Background Dye |

To the Master Batch of Table A were added the components of the first two columns in Tables B and C below.

All mixtures were prepared in 7:1 2-Butanone:2-Propanol at approximately 50% solids. The solutions were coated onto biaxially oriented 80 gauge polyester film and dried to approximately 1% or less retained solvent. The coated mixtures were then laminated onto mechanically scrubbed 1 oz./FR-4/1 oz. clad copper composite using a hot roll laminator at 110° C. at 2 meters/minute and 3 bar pressure.

The laminated material was then imaged on a UV printer through an appropriate phototool with an adjusted exposure to obtain a copper step of 7 as measured with a Stouffer® 21 step wedge (approximately 20 mJ/cm$^2$). The exposed panels were then developed in a 1% sodium carbonate monohydrate solution at 29° C. using a conveyorized spray developer at about 26 psi with residence time adjusted so that the break point occurred at 40% to 50% of the chamber length (unless otherwise noted in the specific example), followed by several spray rinses using tap water and the deionized water.

Etching was accomplished using a 2N cupric chloride/hydrochloric acid solution at 48° C. in a conveyorized etcher equipped with multiple spray nozzles. The etched boards were then stripped of the imaged, developed and etched photo resist in a 3% sodium hydroxide solution at 54° C. in a conveyorized stripping unit equipped with multiple spray nozzles followed by a spray rinse of tap water.

Process responses for the examples are cited at various points throughout the above procedure.

Results are shown in Columns 3–7 of Tables B and C.

TABLE "B"

Effect of Uretbane Substitution

Note Materials listed added to ingredients in table "A"

| Ingredient | Grams added to Exhibit "A" | Fine Line Adhesion[1] | Sidewall Adhesion[2] | Cross Hatch Adhesion[3] | Tent Strength[4] | Strip Time[5] |
|---|---|---|---|---|---|---|
| 1. Ethoxylated Trimethylolpropane Triacrylate | 24 grams | 80$\mu$ | moderate attack | 10% Intact | 350 grams | 52 seconds |
| 2. Isocyanuaric Urethane Triacrylate | 24 grams | 80$\mu$ | moderate attack | 40% Intact | 600 grams | 59 seconds |

Effect of Urethane Subsitution and Dibenzoate Addition

TABLE "C"

Note Materials listed added to ingredients in Table "A"

| Mononer/Oligomer Added to Exhibit "A" | Plasticizer Added to Exhibit "A" | Fine Line Adhesion[1] | Sidewall Adhesion[2] | Cross Hatch Adhesion[3] | Tent Strength[4] | Strip Time[5] |
|---|---|---|---|---|---|---|
| 3. 24 Grams Ethoxylated Trimethylolpropane Triacrylate | no addition of plasticizer | 80$\mu$ | moderate attack | 10% Intact | 350 grams | 52 seconds |
| 4. 24 Grams Ethoxylated Trimethylolpropane Triacrylate | 4 grams dipropylene glycol dibenzoate | 60$\mu$ | slight attack | 90% Intact | 500 grams | 34 seconds |
| 5. 24 Grams Isocyanuaric Urethane Triacrylate | 4 grams dipropylene glycol dibenzoate | 50$\mu$ | no attack | 100% Intact | 710 grams | 41 seconds |
| 6. 24 Grams Isocyanuaric Urethane Triacrylate | 4 grams para toluene sulfonamide | 50$\mu$ | very slight attack | 80% Intact | 580 grams | 61 seconds |

TABLE "C"-continued

Note Materials listed added to ingredients in Table "A"

| Mononer/Oligomer Added to Exhibit "A" | Plasticizer Added to Exhibit "A" | Fine Line Adhesion[1] | Sidewall Adhesion[2] | Cross Hatch Adhesion[3] | Tent Strength[4] | Strip Time[5] |
|---|---|---|---|---|---|---|
| 7. 24 Grams Isocyanuaric Urethane Triacrylate | 4 grams diacetone acrylamide | 60μ | slight attack | 70% Intact | 510 grams | 65 seconds |

Note 1 — Fine line adhesion measured after development. It is the smallest line left adhering with a 400 micron space. The exposure was to a Stouffer 21 copper step 7 at a breakpoint in the developing chamber of 25%. Developing solution was 1% $N_2CO_3$ at 30° C.
Note 2 — The degree of resist attack was observed after developing the photoresist in 1% $N_2CO_3$ at 30° C. The exposure was to a Stouffer 21 copper step 7 at a breakpoint in the developing chamber of 25%.
Note 3 — Using a "razor blade like" tool, the developed photoresist is multiple cut in one direction than 90° to the previous cuts. This test measure brittleness and adhesion. The recording percentage is the percent of resist left intact after all the blade cuts (100% = Best). The exposure was to a Stouffer 21 copper step 7 at a breakpoint in the developing chamber of 25%. Developing solution was 1% $N_2CO_3$ at 30° C.
Note 4 — A 0.25 inch hole laminated on both sides with the photoresist. The resist is then exposed and developed (The exposure was to a Stouffer 21 copper step 7 at a breakpoint in the developing chamber of 25%. Developing solution was 1% $Na_2CO_3$ at 30° C). The flexibility of the resist over this "tented" holes is then measured on a force gauge by pressing of the resist with a rounded probe. The force needed to break the tent is recorded in grams.
Note 5 – The resist is exposed to a Stouffer 21 copper step 7 at a breakpoint in the developing chamber of 25% with a developing solution of 1% $Na_2CO_3$ at 30° C. The resist is then etched in cupric chloride at 130° F. After etching, the photoresist is stripped in 3% NaOH at 130° F. and the time is recorded in seconds.

What is claimed is:

1. A photoimageable composition comprising

A) between about 29 and about 69 wt %, based on total weight of A) plus B) plus C), of an organic polymeric binder having sufficient acid functionality to render said photoimageable composition developable in alkaline aqueous solution, B) between about 30 and about 60 wt %, based on total weight of A) plus B) plus C), of an addition polymerizable component comprising α,β-ethylenically unsaturated compounds, said component B) comprising B') an isocyanate trimer having tri-acrylate functionality, said trimer B') being present at between about 2 to about 30 wt % based on total weight of A) plus B) plus C), and B") 0 to about 57 wt % based on total weight of A) plus B) plus C) of other α,β-ethylenically unsaturated compounds, C) between about 0.5 and about 15 wt %, based on total weight of A) plus B) plus C) of an organic, radiation-sensitive free-radical generating system, plus D) between about 1 and about 8 wt %, calculated relative to total weight of A) plus B) plus C) of dipropylene glyco/dibenzoate.

2. A photoimageable composition according to claim 1 wherein B") is present in amounts of at least about 5 wt % relative to total weight of A) plus B) plus C).

3. A photoimageable composition according to claim 1 wherein said free-radical generating system C) comprises 9-phenyl acridine.

* * * * *